(12) United States Patent
Katagiri et al.

(10) Patent No.: US 8,053,680 B2
(45) Date of Patent: Nov. 8, 2011

(54) WIRING BOARD HAVING EFFICIENTLY ARRANGED PADS

(75) Inventors: Fumimasa Katagiri, Nagano (JP); Yasue Tokutake, Nagano (JP); Naoyuki Koizumi, Nagano (JP); Shigeaki Suganuma, Nagano (JP); Michio Horiuchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 409 days.

(21) Appl. No.: 12/394,148

(22) Filed: Feb. 27, 2009

(65) Prior Publication Data
US 2009/0266598 A1 Oct. 29, 2009

(30) Foreign Application Priority Data
Mar. 17, 2008 (JP) .................................. 2008-068533

(51) Int. Cl.
*H05K 1/11* (2006.01)
(52) U.S. Cl. ........................................................ 174/261
(58) Field of Classification Search .................. 174/261, 174/260, 262
See application file for complete search history.

(56) References Cited

U.S. PATENT DOCUMENTS

| 6,469,260 | B2 | 10/2002 | Horiuchi et al. | |
|---|---|---|---|---|
| 7,164,085 | B2 * | 1/2007 | Saiki | 174/261 |
| 7,656,013 | B2 * | 2/2010 | Horiuchi et al. | 257/678 |
| 2004/0194999 | A1 * | 10/2004 | Tomita et al. | 174/250 |

FOREIGN PATENT DOCUMENTS
JP 2001-319992 11/2001
* cited by examiner

*Primary Examiner* — Hae Moon Hyeon
(74) *Attorney, Agent, or Firm* — IPUSA, PLLC

(57) ABSTRACT

A wiring board includes a plate-shaped resin member; chip connection pads provided in the resin member, the chip connection pads having connection surfaces electrically connected to electrode pads provided on a semiconductor chip, the connection surfaces being situated in substantially the same plane as a first surface of the resin member, the first surface being a side where the semiconductor chip is mounted; pads provided in a portion of the resin member, the portion being situated outside an area where the chip connection pads are formed; lead wirings connected to the pads; and conductive wires sealed by the resin member, the conductive wires electrically connecting the chip connection pads and the pads to each other.

5 Claims, 8 Drawing Sheets

WIRING BOARD HAVING EFFICIENTLY ARRANGED PADS

CROSS-REFERENCE TO RELATED APPLICATIONS

This patent application is based upon and claims the benefit of priority of Japanese Patent Application No. 2008-68533 filed on Mar. 17, 2008, the entire contents of which are incorporated herein by reference.

BACKGROUND OF THE INVENTION

1. Field of the Invention

The present invention generally relates to wiring boards. More specifically, the present invention relates to a wiring board having pads electrically connected to chip connection pads via conductive wires.

2. Description of the Related Art

In related art wiring boards, there is a wiring board, for example, illustrated in FIG. 1, whereby electric connection reliability is improved and generation of cross-talk is prevented.

FIG. 1 is a cross-sectional view of the related art wiring board.

As shown in FIG. 1, a related art wiring board 200 includes a plate-shaped resin member 201, chip connection pads 202, pads 203, and conductive wires 205.

The resin member 201 is configured to seal the chip connection pads 202, the pads 203, and the conductive wires 205.

The chip connection pads 202 are provided in a portion of the resin member 201 corresponding to a mounting area of the semiconductor chip 211. The chip connection pads 202 have connecting surfaces 202A where bumps 214 are provided. The connecting surfaces 202A are exposed from the resin member 201. The connecting surfaces 202A are situated in substantially the same plane as an upper surface 201A of the resin member 201. The chip connection pads 202 are electrically connected to electrode pads 212 provided on the semiconductor chip 211 via the bumps 214.

The pads 203 are provided in a portion of the resin member 201 situated outside the mounting area of the semiconductor chip 211. The upper surfaces 203A of the pads 203 are exposed from the resin member 201. The upper surfaces 203A are situated in substantially the same plane as the upper surface 201A of the resin member 201.

The conductive wires 205 are sealed by the resin member 201. First ends of the conductive wires 205 are connected to the chip connection pads 202. Second ends of the conductive wires 205 are connected to the pads 203. Thus, the chip connection pads 202 and the pads 203 are electrically connected to each other via the conductive wires 205. See, for example, Japanese Laid-Open Patent Application Publication No. 2001-319992.

However, in the related art wiring board 200, it is not expected that the pads 203 are efficiently arranged in an area as small as possible. Therefore, it is difficult to make the surface of the wiring board 200 small.

SUMMARY OF THE INVENTION

Accordingly, embodiments of the present invention may provide a novel and useful wiring board solving one or more of the problems discussed above.

More specifically, the embodiments of the present invention may provide a wiring board whereby the surface of the wiring board can be made small by efficiently arranging pads electrically connected to chip connection pads.

One aspect of the present invention may be to provide a wiring board, including:
a plate-shaped resin member;
chip connection pads provided in the resin member, the chip connection pads having connection surfaces electrically connected to electrode pads provided on a semiconductor chip, the connection surfaces being situated in substantially the same plane as a first surface of the resin member, the first surface being a side where the semiconductor chip is mounted;
pads provided in a portion of the resin member, the portion being situated outside an area where the chip connection pads are formed;
lead wirings connected to the pads; and
conductive wires sealed by the resin member, the conductive wires electrically connecting the chip connection pads and the pads to each other,
wherein the number of the pads arranged in a first direction is m (m≧2) and the number of the pads arranged in a second direction is n (n≧2);
the pads and the lead wirings are arranged, so that a length L in the first direction of the area where the pads and lead wirings are formed satisfies the following formula 1 and a length W in the second direction of the area where the pads and lead wirings are formed is satisfies the following formula 2;

$$L \geq mP \qquad \text{[Formula 1]}$$

$$W \cong w_s + nw_p + (n-1)w \qquad \text{[Formula 2]}$$

where P represents an arrangement pitch in the first direction of the chip connection pads; $w_s$ represents a length in the second direction between the chip connection pad and the pad arranged in a position neighboring the chip connection pad; $w_p$ represents a width in the second direction of the pad; and w represents a length between the pads arranged in the second direction.

Additional objects and advantages of the embodiments are set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 2 through FIG. 8 of embodiments of the present invention.

Figure 1:
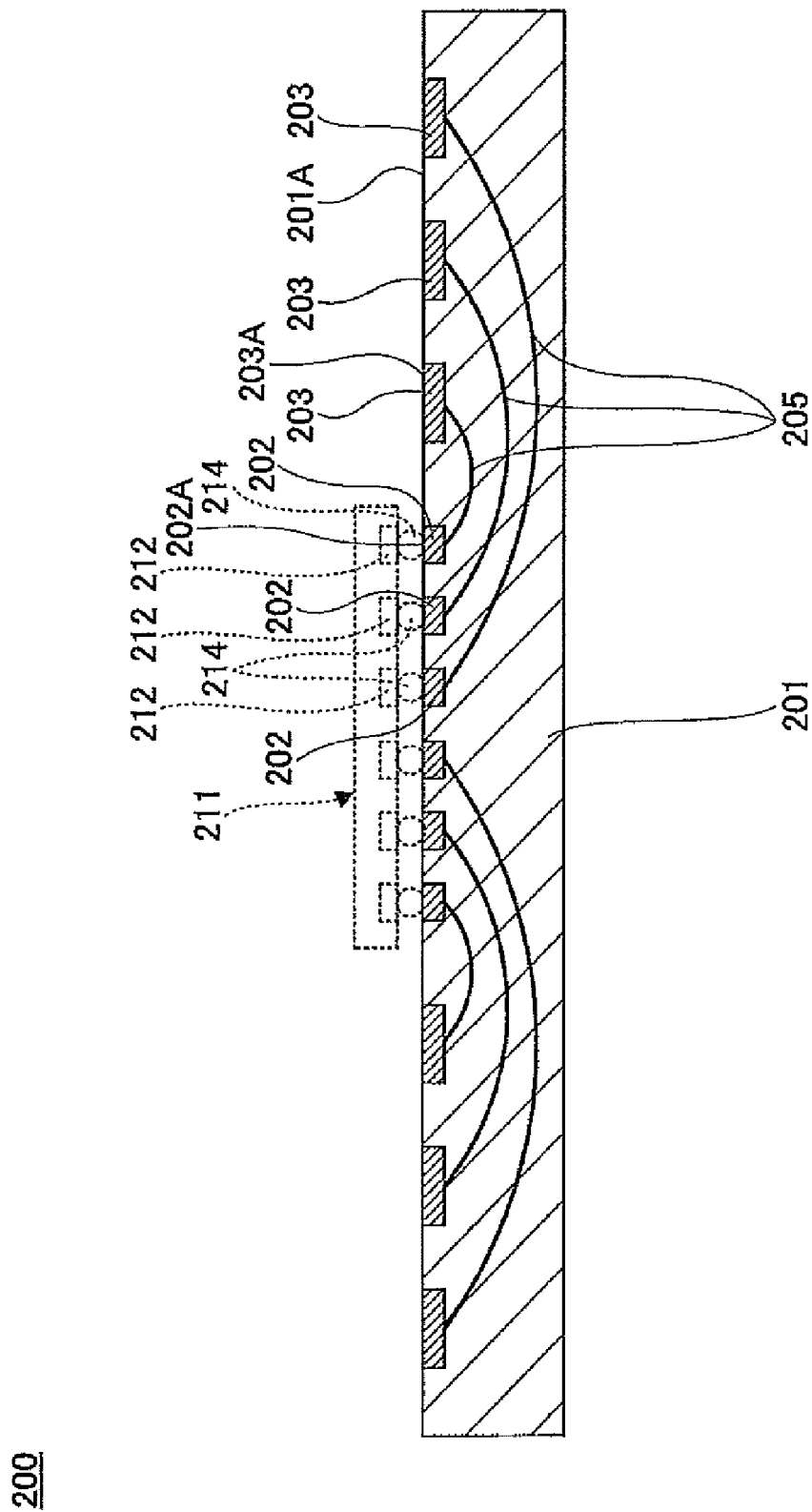
FIG. 1 is a cross-sectional view of a related art wiring board.
Figure 2:
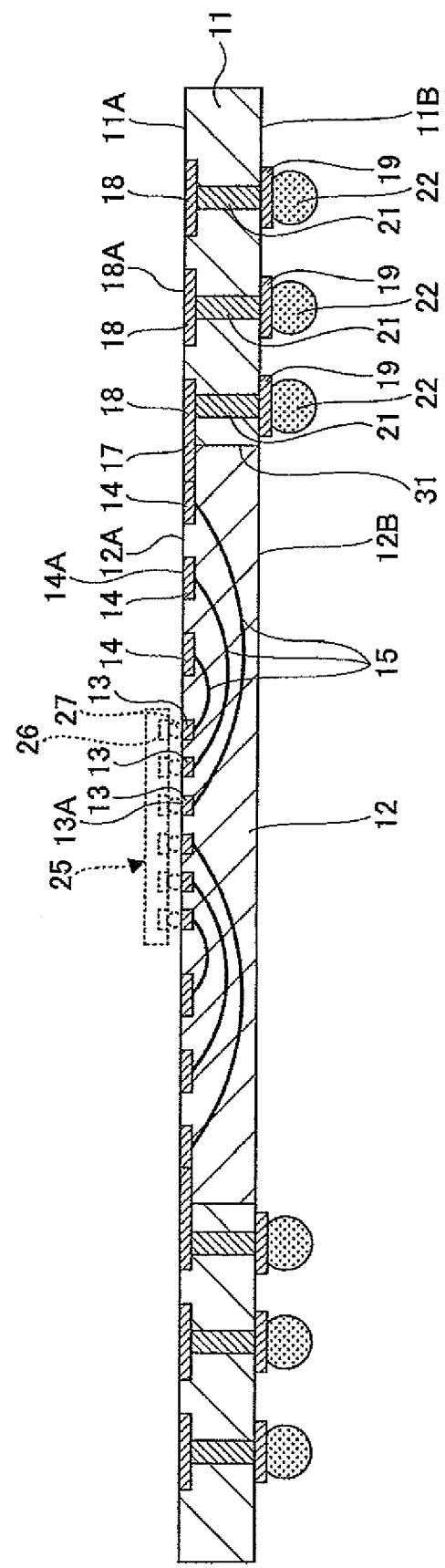
FIG. 2 is a cross-sectional view of a wiring board of a first embodiment of the present invention.

FIG. 2 is a cross-sectional view of a wiring board of an embodiment of the present invention.

As shown in FIG. 2, a wiring board 10 of the embodiment of the present invention includes a board main body 11, a resin member 12, chip connection pads 13, pads 14, conductive wires 15, lead wirings 17, piercing electrode pads 18, outside connection pads 19, and piercing electrodes 21.

The board main body 11 is a thin plate. A piercing part 31 is situated in the center part of the board main body 11. The piercing part 31 is a space configured to receive the resin member 12. As a material of the board main body 11, for example, a glass epoxy resin board can be used. The glass epoxy resin board comprises glass fibers covered with epoxy resin. The board main body 11 has a thickness of, for example, approximately 300 μm.

The resin member 12 has a plate shape and is received in the piercing part 31. The thickness of the resin member 12 is substantially the same as that of the board main body 11. An upper surface (first surface) 12A of the resin member 12 is situated in substantially the same plane as an upper surface 11A of the board main body 11. In addition, a lower surface (second surface) 12B of the resin member 12 is situated in substantially the same plane as a lower surface 11B of the board main body 11. As a material of the resin member 12, for example, epoxy resin, polyimide resin, silicon group elastomer, low elastic polyimide resin, polyolefin resin, or the like can be used.

By using the silicon group elastomer, the low elastic polyimide resin, the polyolefin resin, or the like, as the material of the resin member 12, it is possible to avoid a concentration of stress in end parts of the conductive wires 15 connected to the chip connection pads 13 and the pads 14. Accordingly, it is possible to improve electric connection reliability of the wiring board 10.

The chip connection pads 13 have connection surfaces 13A. The chip connection pads 13 are provided in a portion of the resin member 12 corresponding to a mounting area of a semiconductor chip 25, so that the connection surfaces 13A are situated in substantially the same plane as the upper surface 12A of the resin member 12. Because of this, the connection surfaces 13A are exposed from (not covered by) the resin member 12. The chip connection pads 13 are electrically connected to electrode pads 26 provided on the semiconductor chip 25 via bumps 27 provided on the connection surfaces 13A. An arrangement pitch P of the chip connection pads 13 is substantially the same as an arrangement pitch of the electrode pads 26. As a material of the chip connection pads 13, for example, copper (Cu) can be used. The thicknesses of the chip connection pads 13 may be, for example, approximately 20 μm.

The pads 14 are provided in a portion of the resin member 12 situated outside an area where the chip connection pads 13 are formed, so that the upper surfaces 14A of the pads 14 are situated in substantially in the same plane as the upper surface 12A of the resin member 12. The pads 14 are provided on the same plane surface as the chip connection pads 13. In other words, the upper surfaces 14A of the pads 14 are substantially in the same plane as the connection surfaces 13A. The pads 14 are electrically connected to the chip connection pads 13 via the conductive wires 15. The number of the pads 14 arranged in a first direction (see FIG. 3) is "m" (m≧2). The number of the pads 14 arranged in a second direction is "n" (n≧2). As a material of the pads 14, copper (Cu) can be used. The thicknesses of the pads 14 may be, for example, approximately 20 μm.

The conductive wires 15 are sealed by the resin member 12. First ends of the conductive wires 15 are connected to lower parts of the corresponding chip connection pads 13. Second ends of the conductive wires 15 are connected to lower parts of the corresponding pads 14. The conductive wires 15 are configured to electrically connect the chip connection pads 13 and the pads 14. As a material of the conductive wires 15, for example, gold (Au), silver (Ag), copper (Cu), nickel (Ni), aluminum (Al) or the like can be used.

The lead wirings 17 are provided in the board main body 11 and the resin member 12, so that upper surfaces 17A of the lead wirings 17 are situated in substantially the same plane as the upper surface 11A of the board main body 11 and the upper surface 12A of the resin member 12. First ends of the lead wirings 17 are connected to the corresponding pads 14. Second ends of the lead wirings 17 are connected to the corresponding piercing electrode pads 18. The lead wirings 17 are configured to electrically connect the pads 14 and the piercing electrode pads 18. As a material of the lead wirings 17, for example, copper (Cu) can be used. A width "l" of the lead wiring can be, for example, approximately 40 μm. In addition, a gap "s" between neighboring lead wirings 17 can be, for example, approximately 40 μm.

The piercing electrode pads 18 are provided in the board main body 11, so that upper surfaces 18A of the piercing electrode pads 18 are situated in substantially the same plane as the upper surface 11A of the board main body 11. The piercing electrode pads 18 are connected to the corresponding lead wirings 17 and the corresponding piercing electrodes 21. As a material of the piercing electrode pads 18, for example, copper (Cu) can be used. The thicknesses of the piercing electrode pads 18 may be, for example, approximately 20 μm.

The outside connection pads 19 are provided on the lower surface 11B of the board main body 11. The outside connection pads 19 are electrically connected to the piercing electrode pads 18 via the piercing electrodes 21. Outside connection terminals 22 are provided on the outside connection pads 19. As a material of the outside connection pads 19, for example, copper (Cu) can be used. The thicknesses of the outside connection pads 19 may be, for example, approximately 20 μm.

The piercing electrodes 21 are provided so as to pierce a part of the board main body 11 between the piercing electrode pads 18 and the outside connection pads 19. Upper ends of the piercing electrodes 21 are electrically connected to the corresponding piercing electrode pads 18. Lower ends of the piercing electrodes 21 are electrically connected to the corresponding outside connection pads 19.

The outside connection terminals 22 are provided on the outside connection pads 19. The outside connection terminals 22 are configured to connect to a mounting board (not shown in FIG. 2) such as a motherboard. As the outside connection terminals 22, for example, solder balls may be used.

Figure 3:
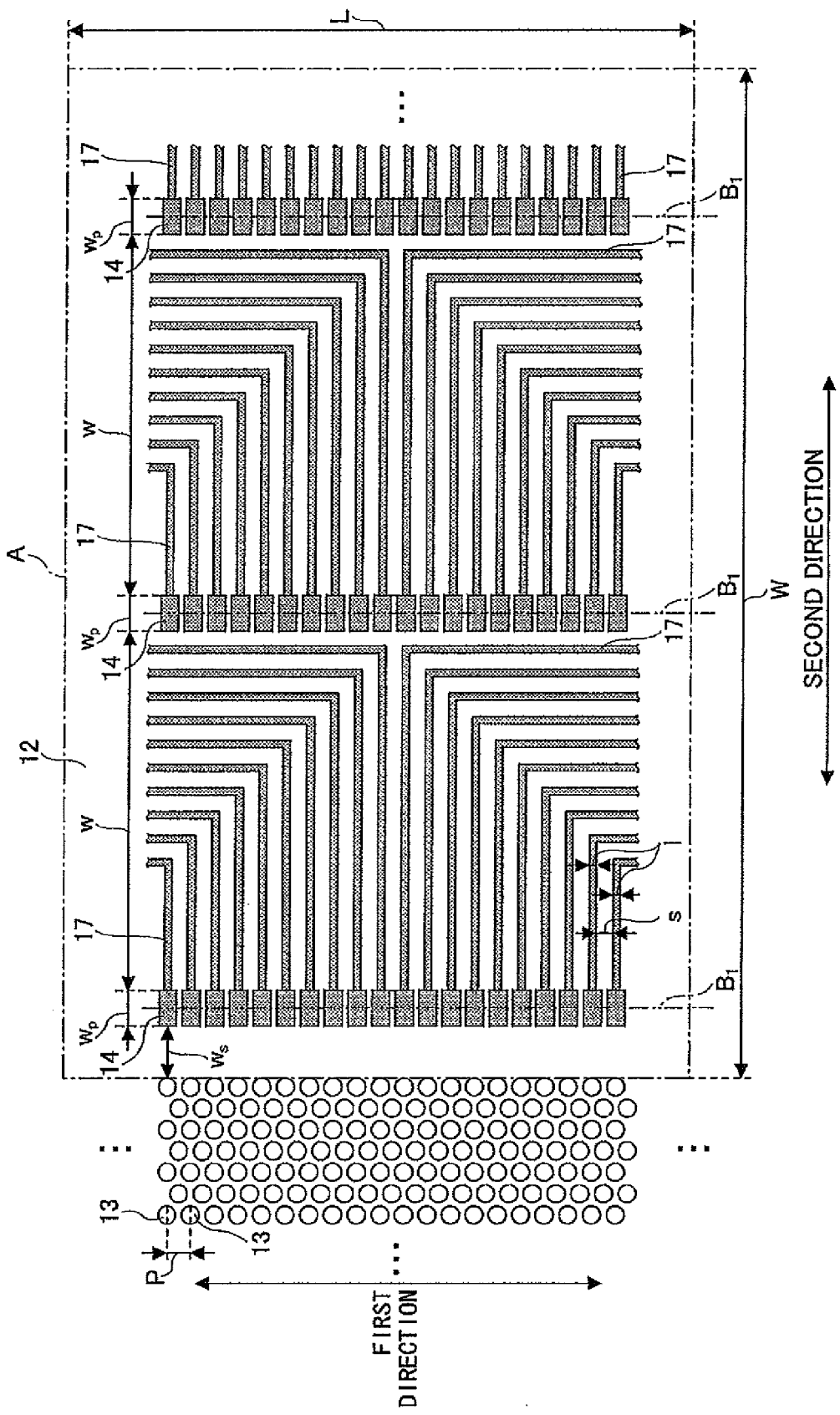
FIG. 3 is a view for explaining a first arrangement example of pads and lead wirings of the embodiment of the present invention.

FIG. 3 is a view for explaining a first arrangement example of the pads and the lead wirings of the embodiment of the present invention. In FIG. 3, the symbol "A" (hereinafter "area A") represents an area necessary for arranging the pads 14 and the lead wirings 17. The symbol "L" (hereinafter "length L in the first direction of a pads and lead wirings forming area") represents a length in the first direction of an area where the pads 14 and the lead wirings 17 are formed. The symbol "W" (hereinafter "length W in the second direction of the pads and lead wirings forming area") represents a length in the second direction of the area where the pads 14 and the lead wirings 17 are formed. The symbol "P" (hereinafter "arrangement pitch P") represents an arrangement pitch in the first direction of the chip connection pads 13. The symbol "$w_s$" (hereinafter "length $w_s$") represents a length in the second direction between the chip connection pads 13 and the pads 14 arranged in a position neighboring the chip connection pads 13. The symbol "$w_p$" (hereinafter "width $w_p$ of the pad 14") represents a width in the second direction of the pad 14. The symbol "w" (hereinafter "length w") represents a length between the pads 14 arranged in the second direction. The symbol "l" (hereinafter "width l") represents a width of the lead wiring 17. The symbol "s" (hereinafter "space s") represents a space between neighboring lead wirings 17. Furthermore, in FIG. 3, parts that are the same as the parts shown in FIG. 2 are given the same reference numerals, and explanation thereof is omitted.

The first arrangement example of the pads 14 and the lead wirings 17 of the embodiment of the present invention is discussed with reference to FIG. 3. In the first arrangement example of the pads 14 and the lead wirings 17, the pads 14 and the lead wirings 17 are arranged in the pads and lead wirings forming area, so that the length L in the first direction of the pads and lead wirings forming area satisfies the following formula 1 and the length W in the second direction of the pads and lead wirings forming area satisfied the following formula 2.

$$L \geq mP \qquad \text{[Formula 1]}$$

$$W \cong w_s + nw_p + (n-1)w \qquad \text{[Formula 2]}$$

Thus, in the first arrangement example of the pads 14 and the lead wirings 17, the pads 14 and the lead wirings 17 are arranged in the pads and lead wirings forming area, so that the length L in the first direction of the pads and lead wirings forming area satisfies with the above-mentioned formula 1 and the length W in the second direction of the pads and lead wirings forming area satisfies the above-mentioned formula 2. Accordingly, it is possible to make the area A of the pads and lead wirings forming area (namely L×W) small. In other words, it is possible to arrange the pads 14 more efficiently. As a result of this, since the surface of the resin member 12 can be made small, it is possible to make the surface of the wiring board 10 small.

More specifically, the pads 14 are arranged on plural straight lines $B_1$ in parallel with the first direction. The plural straight lines $B_1$ are arranged so as to be separated from the neighboring straight lines $B_1$ in the second direction. In addition, the width $w_p$ of the pad 14 in the second direction may be, for example, approximately 200 μm.

Furthermore, in a case where the number of the pads 14 arranged in the first direction is an even number, the length w between the pads 14 arranged in the second direction may be determined so as to satisfy the following formula 3.

$$w \geq \frac{m}{2}(l+s) + s \qquad \text{[Formula 3]}$$

Thus, in this example, in the case where the number of the pads 14 arranged in the first direction is an even number, the length w between the pads 14 arranged in the second direction is determined so as to satisfy the above-mentioned formula 3. As a result of this, it is possible to make the area A of the pads and lead wirings forming area (namely L×W) even smaller. In other words, it is possible to arrange the pads 14 even more efficiently. Therefore, it is possible to make the surface of the wiring board 10 even smaller.

Furthermore, in a case where the number of the pads 14 arranged in the first direction is an odd number, the length w between the pads 14 arranged in the second direction may be determined so as to satisfy the following formula 4.

$$w \geq \frac{m+1}{2}(l+s) + s \qquad \text{[Formula 4]}$$

Thus, in this example, in the case where the number of the pads 14 arranged in the first direction is the odd number, the length w between the pads 14 arranged in the second direction is determined so as to satisfy the above-mentioned formula 4. As a result of this, it is possible to make the area A of the pads and lead wirings forming area (namely L×W) even smaller. In other words, it is possible to arrange the pads 14 even more efficiently. Therefore, it is possible to make the surface of the wiring board 10 even smaller.

More specifically, in the example shown in FIG. 3, the pads 14 arranged on the straight lines $B_1$ parallel to the first direction are divided into two substantially equal parts in upper and lower directions. The lead wirings 17 connected to approximately half of the pads 14 are led in the upper direction in FIG. 3 and the lead wirings 17 connected to approximately another half of the pads 14 are led in the lower direction in FIG. 3. The width l of the lead wiring 17 may be, for example, approximately 40 μm. In addition, the space S in the first direction between the neighboring lead wirings 17 may be, for example, approximately 40 μm.

Figure 4:
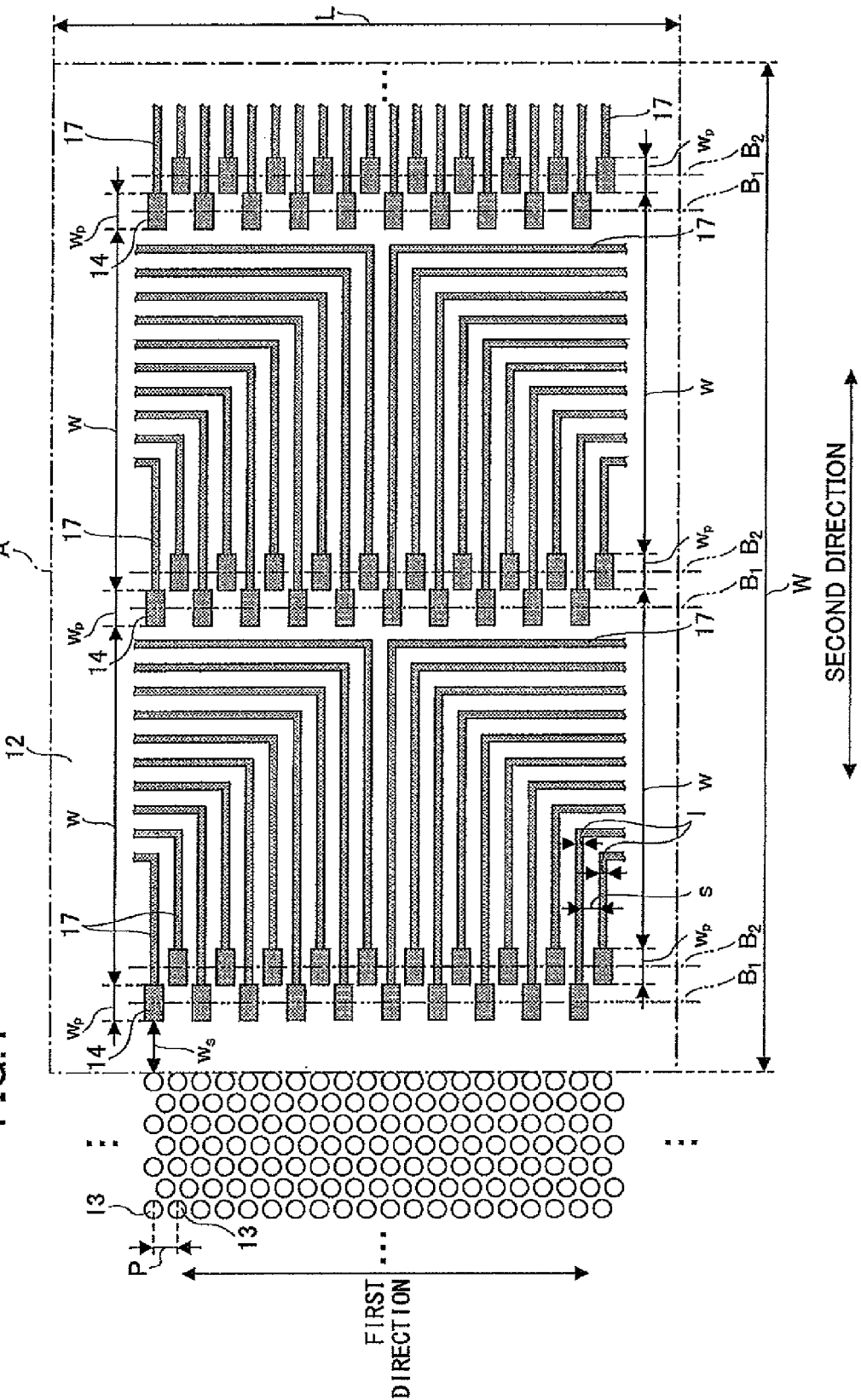
FIG. 4 is a view for explaining a second arrangement example of the pads and the lead wirings of the embodiment of the present invention.

FIG. 4 is a view for explaining a second arrangement example of the pads 14 and the lead wirings 17 of the embodiment of the present invention. In FIG. 4, parts that are the same as the parts shown in FIG. 3 are given the same reference numerals, and explanation thereof is omitted.

As shown in FIG. 4, in the second arrangement example of the pads 14 and the lead wirings 17, the pads 14 arranged on neighboring straight lines $B_1$ and $B_2$ in parallel with the first direction are alternated with each other (staggered arrangement). Other than this, the structure of the second arrangement example is the same as that of the first arrangement example. The straight lines $B_1$ and $B_2$ are provided in plural sets.

In the second arrangement example of the pads 14 and the lead wirings 17 shown in FIG. 4, the length L of the first direction of the pads and lead wirings forming area, the length W of the second direction of the pads and lead wirings forming area, and the length w of the pads 14 in the second direction are determined to satisfy the above-mentioned formula 1 through the above-mentioned formula 4.

Thus, in this example, the pads 14 arranged on neighboring straight lines $B_1$ and $B_2$ parallel to the first direction are alternated with each other. Accordingly, in a case where the semiconductor chip 25 (for example, a semiconductor chip for a CPU) having a large number of the electrode pads 26 is mounted on the wiring board 10 (in other words, a large number of the chip connection pads 13 and the pads 14 are provided on the wiring board 10), it is possible to efficiently arrange the large number of pads 14 in the pads and lead wirings forming area.

In addition, the lines $B_1$ and $B_2$ of the pads 14 are arranged so as to be offset from each other in the second direction. Accordingly, it is possible to prevent the pads 14 from being in close formation so that the degree of freedom of the arrangement positions of the pads 14 can be improved.

Figure 5:
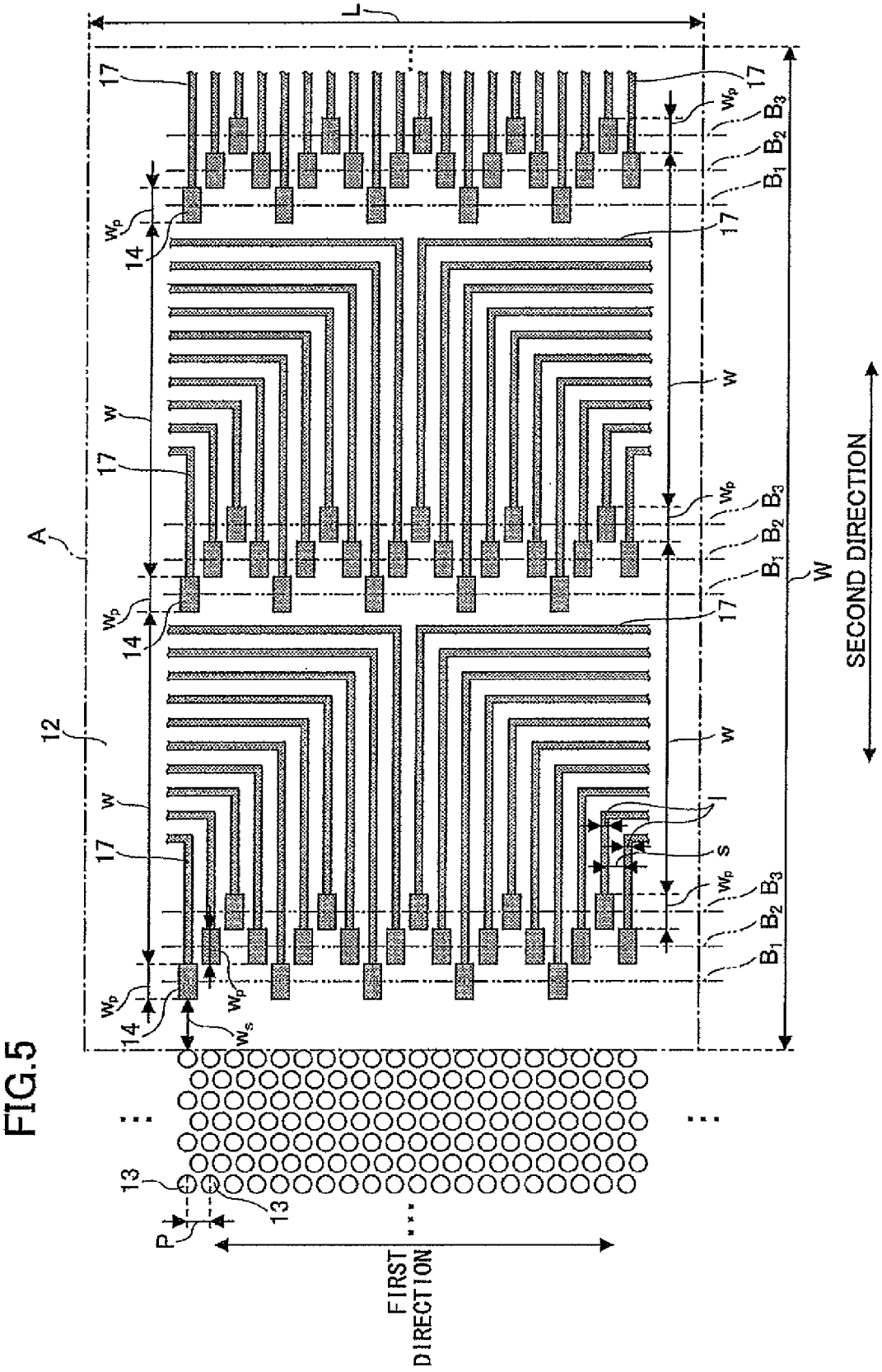
FIG. 5 is a view for explaining a third arrangement example of the pads and the lead wirings of the embodiment of the present invention.

FIG. 5 is a view for explaining a third arrangement example of the pads 14 and the lead wirings 17 of the embodiment of the present invention. In FIG. 5, parts that are the same as the parts shown in FIG. 4 are given the same reference numerals, and explanation thereof is omitted.

As shown in FIG. 5, in the third arrangement example of the pads 14 and the lead wirings 17, the pads 14 arranged on straight lines $B_1$, $B_2$ and $B_3$ parallel to the first direction are alternated with each other (staggered arrangement). Other than this, the structure of the third arrangement example is the same as that of the second arrangement example (see FIG. 4).

In the third arrangement example of the pads 14 and the lead wirings 17 shown in FIG. 5, the length L of the first direction of the pads and lead wirings forming area, the length W of the second direction of the pads and lead wirings forming area, and the length w of the pads in the second direction are determined to satisfy so that the above-mentioned formula 1 through the above-mentioned formula 4.

Thus, in this example, the pads 14 arranged on straight lines $B_1$, $B_2$ and $B_3$ in parallel with the first direction are alternated with each other. Accordingly, in a case where the semiconductor chip 25 (for example, a semiconductor chip for a CPU) having a large number of the electrode pads 26 is mounted on the wiring board 10 (in other words, a large number of the pads 14 are provided on the wiring board 10), it is possible to efficiently arrange the large number of pads 14 in the pads and lead wirings forming area.

In addition, the lines $B_1$ through $B_3$ of the pads 14 are arranged so as to be offset from each other in the second direction as shown in FIG. 5. Accordingly, it is possible to prevent the pads 14 from being in close formation so that the degree of freedom of the arrangement positions of the pads 14 can be improved. The pads 14 may be arranged on four or more straight lines close to each other so as to be offset from each other in the second direction.

Figure 6:
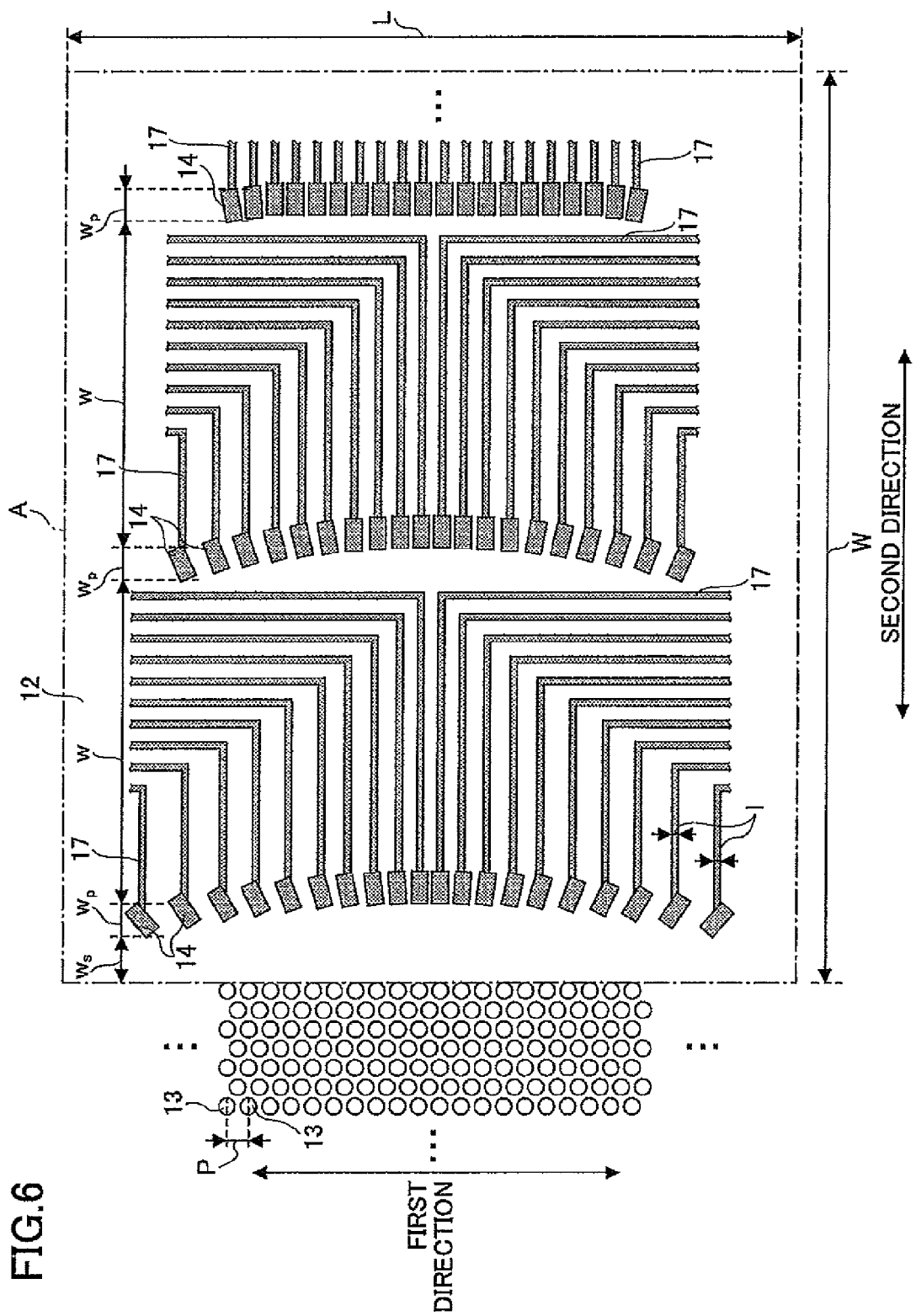
FIG. 6 is a view for explaining a fourth arrangement example of the pads and the lead wirings of the embodiment of the present invention.

FIG. 6 is a view for explaining a fourth arrangement example of the pads 14 and the lead wirings 17 of the embodiment of the present invention. In FIG. 6, parts that are the same as the parts shown in FIG. 3 are given the same reference numerals, and explanation thereof is omitted.

As shown in FIG. 6, in the fourth arrangement example of the pads 14 and the lead wirings 17, the pads 14 are arranged in the shape of arcs.

Since the pads 14 are arranged in arc shapes in this example unlike the second arrangement example of the pads 14 and the lead wirings 17 (see FIG. 4) and the third arrangement example of the pads 14 and the lead wirings 17 (see FIG. 5), it is possible to efficiently arrange the pads 14 without offsetting the lines of the pads in the second direction.

In the fourth arrangement example of the pads 14 and the lead wirings 17, the length L of the first direction of the pads and lead wirings forming area and the length W of the second direction of the pads and lead wirings forming area are determined to satisfy the above-mentioned formula 1 and the above-mentioned formula 2. It should be noted that the widths $w_p$ of the pads in the second direction are different from each other for every line. In addition, the lengths in the first direction of the lines where the pads 14 are arranged are shorter as the lines are further separated from the chip connection pads 13.

Figure 7:
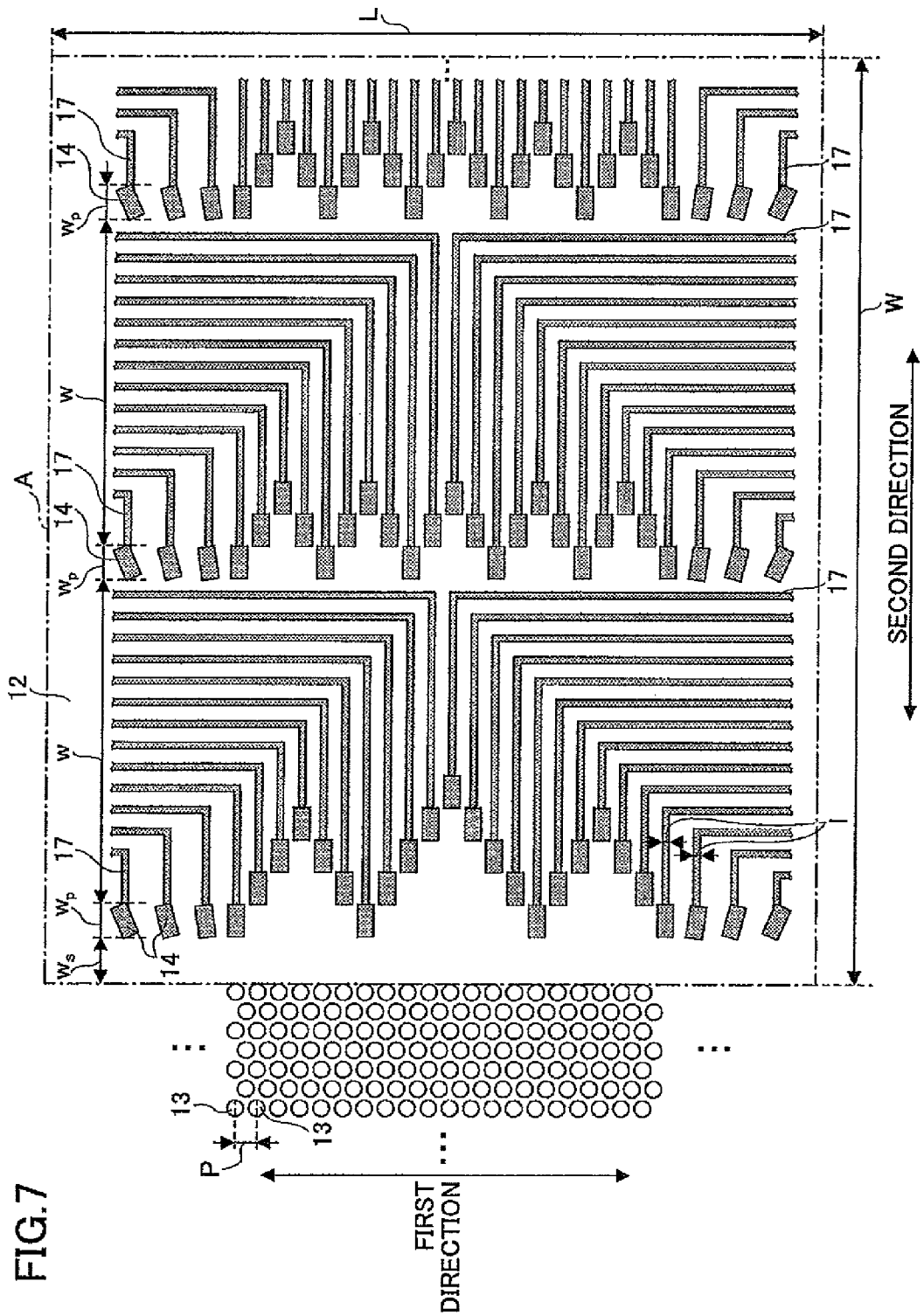
FIG. 7 is a view for explaining a fifth arrangement example of the pads and the lead wirings of the embodiment of the present invention.

FIG. 7 is a view for explaining a fifth arrangement example of the pads 14 and the lead wirings 17 of the embodiment of the present invention. In FIG. 7, parts that are the same as the parts shown in FIG. 6 are given the same reference numerals, and explanation thereof is omitted.

As shown in FIG. 7, in the fifth arrangement example of the pads 14 and the lead wirings 17, the pads 14 positioned in the external circumferential parts of the lines where the pads 14 are arranged are provided in arc shapes. The pads 14 positioned in the center of the lines where the pads 14 are arranged are provided so as to be offset in the second direction.

Since the pads 14 positioned in the external circumferential parts of the lines where the pads 14 are arranged are provided in arc shapes and the pads 14 positioned in the center of the lines where the pads 14 are arranged are provided so as to be offset in the second direction, it is possible to arrange the pads 14 more efficiently. In this case, it is possible to arrange the pads 14 with various layouts without changing conditions of the length W in the second direction of the pads and lead wirings forming area.

Figure 8:
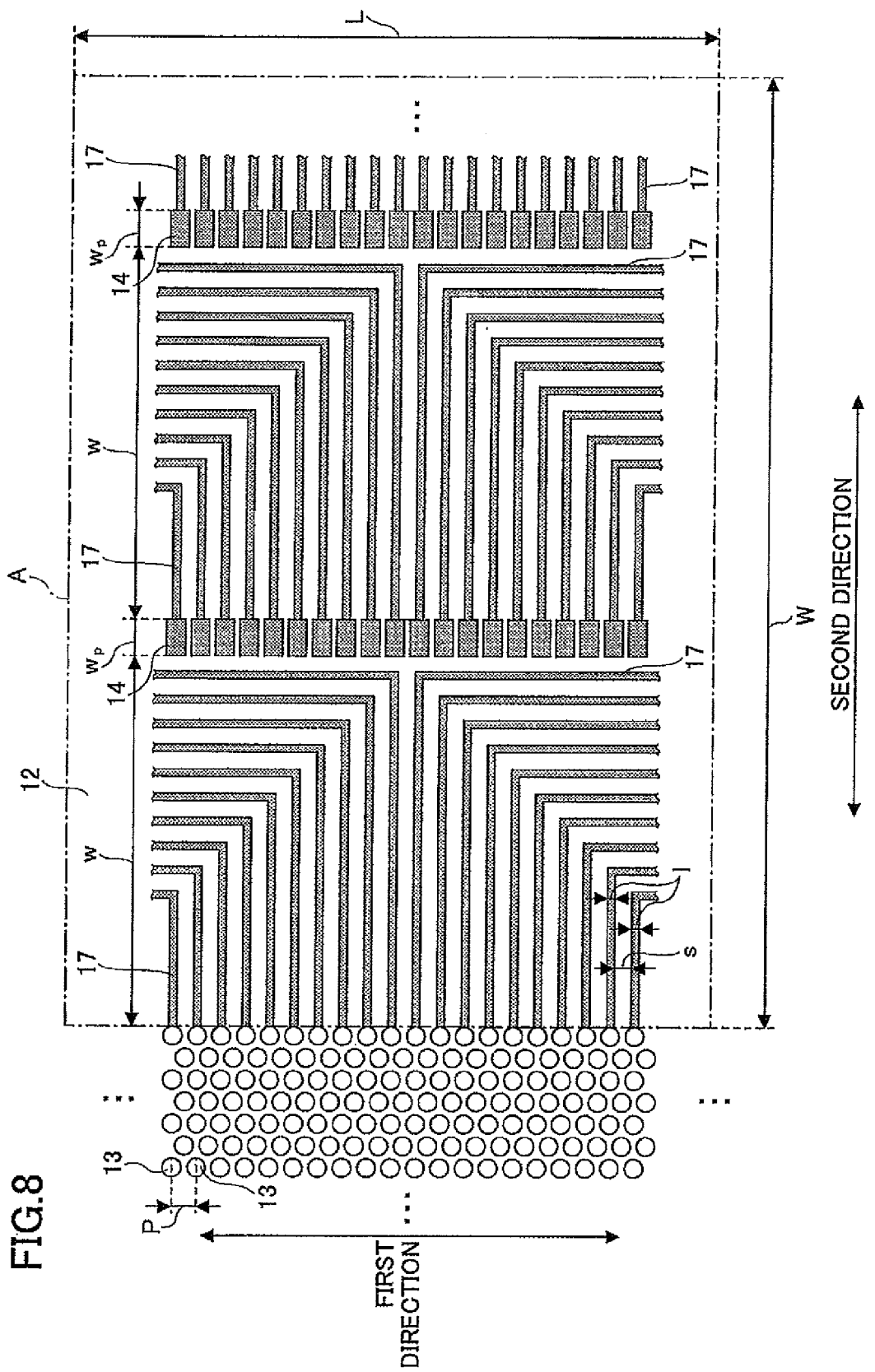
FIG. 8 is a view for explaining a sixth arrangement example of the pads and the lead wirings of the embodiment of the present invention.

FIG. 8 is a view for explaining a sixth arrangement example of the pads 14 and the lead wirings 17 of the embodiment of the present invention. In FIG. 8, parts that are the same as the parts shown in FIG. 3 are given the same reference numerals, and explanation thereof is omitted.

As shown in FIG. 8, in the sixth arrangement example of the pads 14 and the lead wirings 17, the single line of the pads 14 arranged in the vicinity of the chip connection pads 13 shown in FIG. 3 is not provided; instead, the lead wirings, 17 previously shown connected to these pads 14, and the chip connection pads 13 arranged in the vicinity of the lead wirings 17 are connected to each other. Other than this, the structure of this arrangement example is the same as that of the first arrangement example.

Thus, since the single line of the pads 14 arranged in the vicinity of the chip connection pads 13 shown in FIG. 3 is not provided, and the lead wirings 17, previously shown connected to these pads 14, and the chip connection pads 13 arranged in the vicinity of the lead wirings 17 are connected to each other, it is possible to make the area A of the pads and lead wirings forming area (namely L×W) even smaller. Therefore, it is possible to make the size of the surface direction of the wiring board 10 even smaller.

Plural chip connection pads 13 arranged in a part corresponding to a single side of a chip connection pads forming area arranged in a rectangular shape (an area where the chip connection pads 13 are formed) are discussed in the above-mentioned embodiment.

In addition, the first direction mentioned in the embodiment of the present invention means a direction parallel to a single side of the chip connection pads forming area having a rectangular-shaped configuration.

Furthermore, the configuration of the chip connection pads forming area is not limited to that discussed in the embodiment of the present invention and may be polygonal. Furthermore, the arrangement of the chip connection pads 13 may be other than the staggered arrangement.

According to the embodiments of the present invention, it is possible to provide a wiring board, including:

a plate-shaped resin member;

chip connection pads provided in the resin member, the chip connection pads having connection surfaces electrically connected to electrode pads provided on a semiconductor chip, the connection surfaces being situated in substantially the same plane as a first surface of the resin member, the first surface being a side where the semiconductor chip is mounted;

pads provided in a portion of the resin member, the portion being situated outside an area where the chip connection pads are formed;

lead wirings connected to the pads; and conductive wires sealed by the resin member, the conductive wires electrically connecting the chip connection pads and the pads to each other, wherein the number of the pads arranged in a first direction is m (m≧2) and the number of the pads arranged in a second direction is (n≧2);

the pads and the lead wirings are arranged, so that a length L in the first direction of the area where the pads and lead wirings are formed satisfies the following formula 1 and a length W in the second direction of the area where the pads and lead wirings are formed satisfies the following formula 2;

$$L \geq mP \qquad \text{[Formula 1]}$$

$$W \cong w_s + nw_p + (n-1)w \qquad \text{[Formula 2]}$$

where P represents an arrangement pitch in the first direction of the chip connection pads; $w_s$ represents a length in the second direction between the chip connection pad and the pad arranged in a position neighboring the chip connection pad; $w_p$ represents a width in the second direction of the pad; and w represents a length between the pads arranged in the second direction.

Since the pads and the lead wirings are arranged so that the length L in the first direction of the area where the pads and lead wirings are formed satisfies the above-mentioned formula 1 and the length W in the second direction of the area where the pads and lead wirings are formed satisfies the above-mentioned formula 2, it is possible to efficiently arrange the pads. Therefore, it is possible to make small the area of the pads and lead wirings forming area when seen in a plan view manner (namely L×W). As a result of this, since the surface area of the resin member can be made small, it is possible to make the surface area of the wiring board small.

Thus, according to the embodiments of the present invention, it is possible to provide a wiring board whereby a surface area of the wiring board can be made small by efficiently arranging pads electrically connected to chip connection pads. In addition, the embodiments of the present invention can be applied to the wiring boards having the pads electrically connected to the chip connection pads via the conductive wires.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A wiring board, comprising:
a plate-shaped resin member;
piercing electrode pads provided on the plate-shaped resin member;
chip connection pads provided in the resin member, the chip connection pads having connection surfaces electrically connected to electrode pads provided on a semiconductor chip, the connection surfaces being situated in substantially the same plane as a first surface of the resin member, the first surface being a side where the semiconductor chip is mounted;
pads provided in a portion of the resin member, the portion being situated outside an area where the chip connection pads are formed;
lead wirings connected to the pads at one end and connected to the piercing electrode pads at the other end; and
conductive wires sealed by the resin member, the conductive wires electrically connecting the chip connection pads and the pads to each other, wherein the number of the pads arranged in a first direction is m≧2) and the number of the pads arranged in a second direction is n (n≧2);

the pads and the lead wirings are arranged in an L×W area located on the resin member outside the area where the chip connection pads are provided, so that a length L in the first direction of the area where the pads and lead wirings are formed satisfies the following formula 1 and a length W in the second direction of the area where the pads and lead wirings are formed satisfies the following formula 2;

$$L \leq mP \qquad \text{[Formula 1]}$$

$$W \cong w_s + nw_p + (n-1)w \qquad \text{[Formula 2]}$$

where P represents an arrangement pitch in the first direction of the chip connection pads; $w_s$ represents a length in the second direction between the chip connection pad and the pad arranged in a position neighboring the chip connection pad; $w_p$ represents a width in the second direction of the pad; and w represents a length between the pads arranged in the second direction.

2. The wiring board as claimed in claim 1,
wherein, in a case where m is an even number, the length w between the pads arranged in the second direction is determined to satisfy the following formula 3

$$w \geq \frac{m}{2}(l+s) + s \qquad \text{[Formula 3]}$$

where l represents a width of the lead wiring; and s represents a gap between the neighboring lead wirings.

3. The wiring board as claimed in claim 1,
wherein, in a case where m is an odd number, the length w between the pads arranged in the second direction is determined to satisfy the following formula 4

$$w \geq \frac{m+1}{2}(l+s) + s \qquad \text{[Formula 4]}$$

where l represents a width of the lead wiring; and s represents a gap between the neighboring lead wirings.

4. The wiring board as claimed in claim 1,
wherein the pads have substantially the same thicknesses as thicknesses of the chip connection pads and are situated in the same plane surface as the chip connection pads; and
surfaces of the pads positioned at a first surface side are exposed from the resin member.

5. The wiring board as claimed in claim 1,
wherein an arrangement pitch of the chip connection pads is substantially the same as an arrangement pitch of the electrode pads.

* * * * *